(12) United States Patent
Sedlacik

(10) Patent No.: US 8,170,077 B2
(45) Date of Patent: May 1, 2012

(54) INTERNAL MEMORY FOR TRANSISTOR OUTLINE PACKAGES

(75) Inventor: Radek Sedlacik, Perak (MY)

(73) Assignee: Finisar Corporation, Sunnyvale, CA (US)

( * ) Notice: Subject to any disclaimer, the term of this patent is extended or adjusted under 35 U.S.C. 154(b) by 713 days.

(21) Appl. No.: 12/133,101

(22) Filed: Jun. 4, 2008

(65) Prior Publication Data

US 2009/0302881 A1 Dec. 10, 2009

(51) Int. Cl.
*G01R 31/26* (2006.01)
*H01S 5/026* (2006.01)

(52) U.S. Cl. ..................... 372/50.1; 372/38.01

(58) Field of Classification Search .................. 324/767; 372/50.1, 29.021, 29.02, 38.01, 38.02
See application file for complete search history.

(56) References Cited

U.S. PATENT DOCUMENTS

| | | | |
|---|---|---|---|
| 2002/0025608 A1* | 2/2002 | Shinonaga et al. | 438/127 |
| 2006/0139774 A1* | 6/2006 | Pfnuer et al. | 359/819 |
| 2006/0274796 A1* | 12/2006 | Cheng et al. | 372/29.021 |
| 2009/0202256 A1* | 8/2009 | Chen | 398/182 |

* cited by examiner

*Primary Examiner* — Victor A Mandala
*Assistant Examiner* — Whitney T Moore
(74) *Attorney, Agent, or Firm* — Morgan, Lewis & Bockius LLP

(57) ABSTRACT

A transistor outline (TO) package includes a housing having a window and a substrate. Circuitry is coupled to the substrate within the housing. The circuitry comprises a laser diode and memory configured to store information related to the TO package. Electrical connectors are coupled to the substrate at the opposite side to the circuitry. At least one of the electrical connectors is electrically connected to the memory. A disclosed method includes assembling a TO package, testing the TO package, storing results of the testing in memory, and making the information stored in the memory, including the results of the testing, available to a device external to the TO package. The TO package includes a laser diode and memory configured to store information related to the TO package.

20 Claims, 7 Drawing Sheets

Data stored in Memory 600

| Location | Value |
|---|---|
| 1 | Slope efficiency |
| 2 | Operating current for a given monitoring current |
| 3 | Threshold current of the laser |
| 4 | Serial number |
| 5 | Data representing the LI curve |
| 6 | Data representing the IMON curve |
| 7 | Spectral properties of laser diode |
| 8 | Test results at temperature 1 |
| ⋮ | ⋮ |
| N | Test results at temperature N |

FIGURE 6

LI Curve
700

LI curve or Light-Current curve

IMON curve or Light curve at monitoring temperature

INTERNAL MEMORY FOR TRANSISTOR OUTLINE PACKAGES

FIELD

The subject matter disclosed herein relates generally to testing and manufacturing optoelectronic devices, and in particular to a system and method for recording and storing laser transmitter properties within a laser transmitter package.

BACKGROUND

Transistor outline (TO) packages are widely used in the field of optoelectronics and can be employed in a variety of applications. TO packages can often be standardized to facilitate their incorporation into optoelectronic devices such as optical transceivers. TO packages can also be configured to electrically connect internal hermetically sealed optoelectronic components to external components such as printed circuit boards (PCBs). Furthermore, TO packages can often include a metallic header with conductive pins or electrical connectors extending completely through and, generally perpendicular to, the header. The header can often be sized to fit a specific TO-standard size and pin configuration, examples of which include a TO-5 or TO-46 package.

Optoelectronic components, such as a laser diode, can be mounted on one side of the header and connected to the electrical connectors. Generally, a housing encloses the side of the header on which such components are mounted, so as to form a chamber that helps prevent contamination or damage to the internal optoelectronic components. The design of the package can depend on the optoelectronic component being mounted on the header and the modular component with which the package will be used. For example, in applications where the optoelectronic device mounted on the header is a laser diode, the housing can be at least partially transparent to allow an optical signal generated by the laser to be transmitted form the package. Such TO packages may also be known as window cans.

Testing TO packages is typically performed at each of the component (e.g., the TO package), subassembly, and assembled optoelectronic device levels. However, testing at all of these levels is costly and inefficient. As such, a system and method for reducing the cost and efficiency of testing, assembly, and manufacturing would be highly desirable.

SUMMARY

An optoelectronic TO package is disclosed. The optoelectronic TO package comprises a housing having a window and a substrate. Circuitry is coupled to the substrate within the housing. In some embodiments, the circuitry comprises a laser diode and memory configured to store information related to the TO package, such as diagnostic information. Electrical connectors are coupled to the substrate and extend from the side opposite of the substrate to the circuitry. At least one of the electrical connectors is electrically connected to the memory.

A disclosed method includes assembling a TO package, testing the TO package, storing results of the testing in memory, and making the information stored in the memory, including the results of the testing, available to a device external to the TO package. The TO package includes a laser diode and memory configured to store information related to the TO package.

BRIEF DESCRIPTION OF THE DRAWINGS

For a better understanding, reference should be made to the following detailed description taken in conjunction with the accompanying drawings, in which:

FIG. 6 is an exemplary memory map of the memory in the TO package shown in FIGS. 1-4, according to some embodiments.

Like reference numerals refer to corresponding parts throughout the drawings.

DETAILED DESCRIPTION OF EMBODIMENTS

Figure 1A:
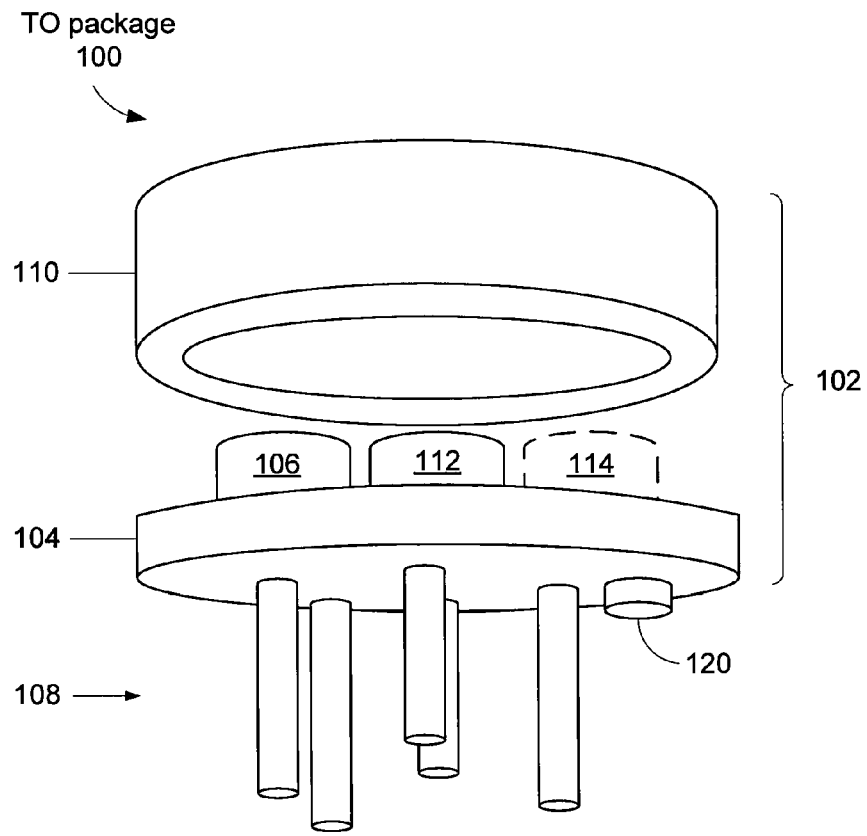
FIG. 1A is perspective exploded view of an optoelectronic TO package according to some embodiments.

For convenience, the terms "transistor outline (TO) package," and "TO can" are used interchangeably herein unless otherwise indicated. TO packages were developed based on early transistors and modified to protect integrated circuits from damage. Because TO packages are often metallic, they are sometimes known as TO cans. In cases where a TO package protects a laser, a laser diode, light emitting diode (LED), or the like, it may be referred to as a TO package. One skilled in the art will recognize that TO cans may also be used as packages for packaging photodiodes and/or other components. Specific examples discussed herein refer to a TO can or a TO package, in a transmitter optical subassembly (TOSA) of an optoelectronic transceiver, but similar embodiments are also possible.

By adding memory to a TO package, data such as test results, can be stored within the sealed TO package. In other words, during and after assembly or manufacturing, the relevant diagnostic and test data for the TO can or TOSA performance can be stored in the memory in the TO package. In use, or during assembly, individual package test data can be made available to an external device or optoelectronic device assembly for use, analysis, and/or calibration. In some embodiments, the test data can be accessed for an individual TO can, thereby allowing an optoelectronic transceiver to adjust the bias point more precisely. The bias point can be set by an external microprocessor, by the optical transceiver, or it may be set during assembly.

The electrical, optical, and thermal properties of a TO package may provide an indication as to the properties of the fully-assembled optoelectronic device. As technology develops, accurate test data about each component at each stage in the manufacturing process becomes important for improving both component quality and yield. In addition, components may be manufactured and/or assembled by different entities. Each entity, manufacturing process, and assembly process may perform tests to ensure the product is of adequate quality. Test data may also be used to configure the system. This repeated testing results in high costs and inefficiencies.

Accurate testing allows manufacturers to ensure that a package, and the final product itself, meets specifications. Test data may show that some or all of the packages in a batch exceed requirements, which may allow assembly of devices meeting more stringent specifications. Testing can also increase the yield by providing feedback of when the manufacturing process yields inadequate packages. With this feedback, a manufacturer can identify and correct problems in the manufacturing process.

If a TO package is manufactured by a component manufacturer, the system level manufacture uses data on package properties to decide whether to accept the TO package, and to configure the system. Ideally, data on package properties is specific to each TO package. Testing at a component level, rather than the batch level, also increases time and costs for the manufacturer. For example, testing an individual component may allow a manufacturer to salvage some TO packages in an otherwise bad batch. Testing at the subcomponent level may also allow for further refinements in the design or manufacture of the subcomponent. In addition, individual testing data allows for more accurate calibration at the system level, which can also increase yield and quality. It is also useful to maintain and correlate test data between a package, an optical subassembly (OSA) and an assembled optoelectronic transceiver.

The earlier in the manufacturing process that tests can be performed, the earlier a weakness or defect in the process or component can be discovered. Early discovery results in time and cost savings for the manufacture. Even though packages are relatively expensive, it is not generally economically feasible to replace package once the have been mounted on a board or an OSA. It is easier to discard the entire board or subassembly, even with some valuable working components, than it is to replace a single failed component. Thus, component testing prior to assembly can be used to minimize the risk of mounting a defective complements. Although this testing adds costs to the assembly process, the added costs are less than those encountered when a board is assembled with a defective component and discarded.

Thus, in some embodiments, testing of an optoelectronic transceiver is performed at the component level (e.g., at different temperatures), and stored in the memory located on the component. In doing so, the need for additional testing at the subassembly and assembly levels can be eliminated, thereby reducing costs and time. Note that testing at the subassembly and/or assembly levels can still be performed to further validate that the subassembly and/or assembly is not defective.

Reference will now be made in detail to various embodiments, examples of which are illustrated in the accompanying drawings. Numerous specific details are provided to aid in understanding embodiments of the present invention. However, it will be apparent to one of ordinary skill in the art that the present invention may be practiced without these specific details. In other instances, well-known methods, procedures, components, and circuits have not be described in detail so as not to unnecessarily obscure aspects of the embodiments.

Figure 1B:
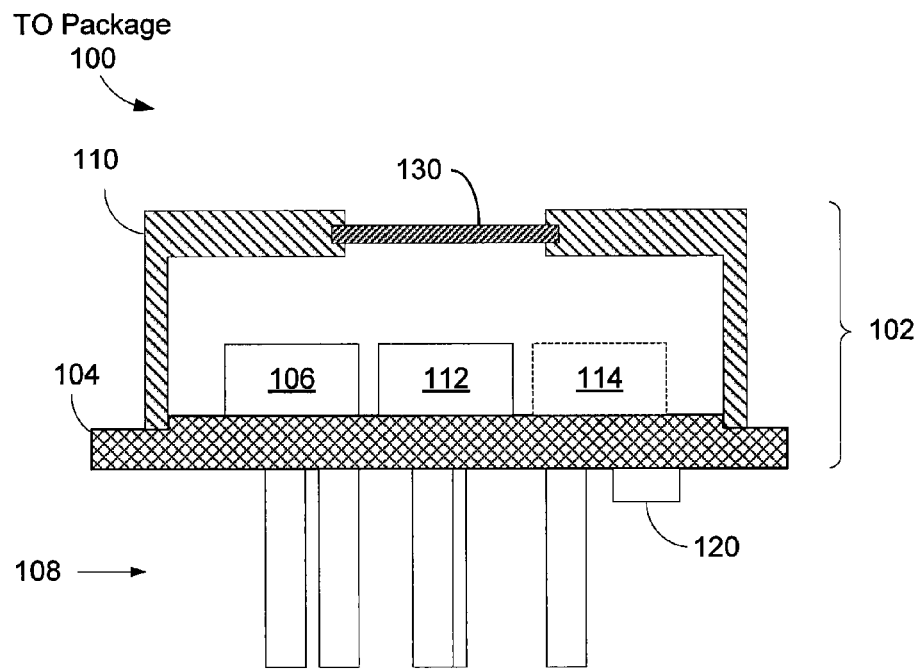
FIG. 1B is a cross sectional view of the TO package of FIG. 1A, according to some embodiments.

FIG. 1A is a perspective exploded view of a TO package 100, according to some embodiments. The TO package 100 includes a housing 102 having a window (not shown) at one end and a header board 104, or "header" as used hereinafter, at the other end. As FIG. 1A shows, the housing 102 may comprise a cover 110 that may be affixed to the header 104 during assembly as shown in FIG. 1B. In some embodiments, the header 104 may be at least partially enclosed by the cover 110. While FIG. 1A shows a generally cylindrical TO package, other shapes and configurations may be used.

The header 104 can include one or more components, such as semiconductor devices or ICs, including, but not limited to, memory (e.g., non-volatile memory), a linear amplifier, a laser diode, an integrated memory/amplifier IC, etc. For example, as illustrated in FIG. 1A, the header 104 can include a memory 106, an optical component 112, and optionally an amplifier 114. Note that depending on the application, the number of semiconductor devices or ICs located on the header 104 can be more or fewer than what is shown in FIG. 1A. In some embodiments, the memory 106 can be non-volatile memory. In some embodiments, the memory 106 can be an electrically erasable programmable read-only memory (EEPROM). Furthermore, the memory 106 can be a distinct IC or it can be integrated with a linear amplifier IC as discussed more fully below. In some embodiments, the memory 106 in the TO package 100 can include analog and/or digital circuitry. In some embodiments, the TO package 100 can include an analog-to-digital (A/D) converter. In these embodiments, A/D conversion can be performed by circuitry external to the TO package 100 and the digital diagnostic values can be sent back to the TO package 100 for storage in the memory 106.

The TO package 100 also includes one or more electrical connectors 108 which can be used to electrically couple the semiconductor devices or ICs to components outside of the TO package 100 (e.g., an external device). The one or more electrical connectors 108 may include a common ground and a power supply, one or more pins dedicated for the laser diode signals, and one or more pins for sending, receiving, and/or writing digital test data to the memory. In some embodiments, the memory pins may include one or more pads 120 for pogo pins (not shown). In some embodiments, a specified set of memory pins can be shared pins. In other embodiments, none of the pins are shared. Note that a shared pin can carry different signals at different times and/or out-of-band signals.

FIG. 1B shows a cross section of the TO package 100 of FIG. 1A after assembly. As illustrated in FIG. 1B, the cover 110 includes a window 130. In some cases, the window 130 is opposite the header 104 and the optical component 112, as illustrated. Note that other configurations are also possible. In some embodiments, the window 130 can be arranged so that the optical path between the window 130 and the optical component 112 is direct and unobstructed.

Figure 1C:
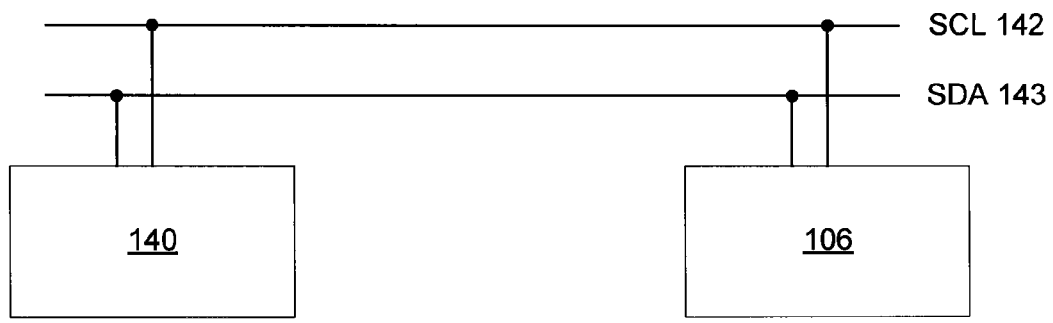
FIG. 1C is a schematic diagram of a device and a memory, according to some embodiments.

In some embodiments, the memory 106 can be coupled to a device (either within the TO package 100 or external to the TO package 100) through a serial clock (SCL) line and a serial data (SDA) line, such as using I2C or I$^2$C. FIG. 1C is a schematic diagram of a device 140 and the memory 106, according to some embodiments. The device 140 can communicate with the memory 106 through an SCL line 142 and/or an SDA line 143. In some embodiments, the device 140 is located on the header 104 within the TO package 100. In other embodiments, the device 140 is external to the TO package 100. In these embodiments, the portions of the SCL line 142 and the SDA line 143 that are within the TO package 100 are coupled to the one or more electrical connectors 108. The corresponding electrical connectors on the device 140 that are associated with the SCL line 142 and the SDA line 143 can then be coupled to the one or more electrical connectors 108, thereby electrically coupling the memory 106 with the device 140.

Figure 1D:
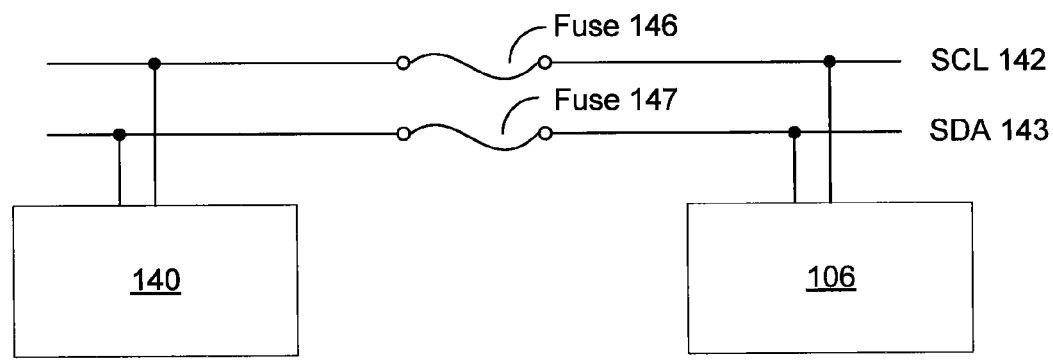
FIG. 1D is a schematic diagram of a device, a memory, and fuses, according to some embodiments.

In some embodiments, an external device or a component within the TO package 100 can program or blow a fuse to cutoff access to the memory 106 after assembly or partial assembly of an optical transceiver. This is illustrated in FIG. 1D, which includes the same elements as FIG. 1C, except that fuses 146 and 147 are located on the SCL line 142 and/or the SDA line 143 between the device 140 and the memory 106. Note that if the device 140 is external to the TO package 100, the fuses are located on the SCL line 142 and/or the SDA line 143 between the memory 106 and electrical connectors for the TO package 100 which are associated with the SCL line 142 and/or the SDA line 143, respectively. In some embodiments, the fuses are located within the memory 106.

Figure 2:
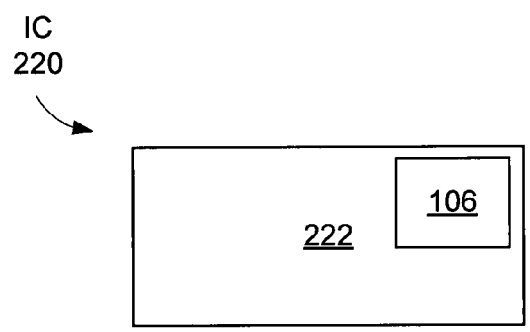
FIG. 2 is a block diagram of a semiconductor device including an analog chipset and memory, according to some embodiments.

In some embodiments, the memory can be integrated within an analog chipset within the TO package 100. The analog chipset can include, but is not limited to, an amplifier, a linear amplifier, or other chipset useful in a TO package. FIG. 2 is a block diagram illustrating an IC 220 which includes an analog chipset 222, which itself includes the memory 106.

Figure 3:
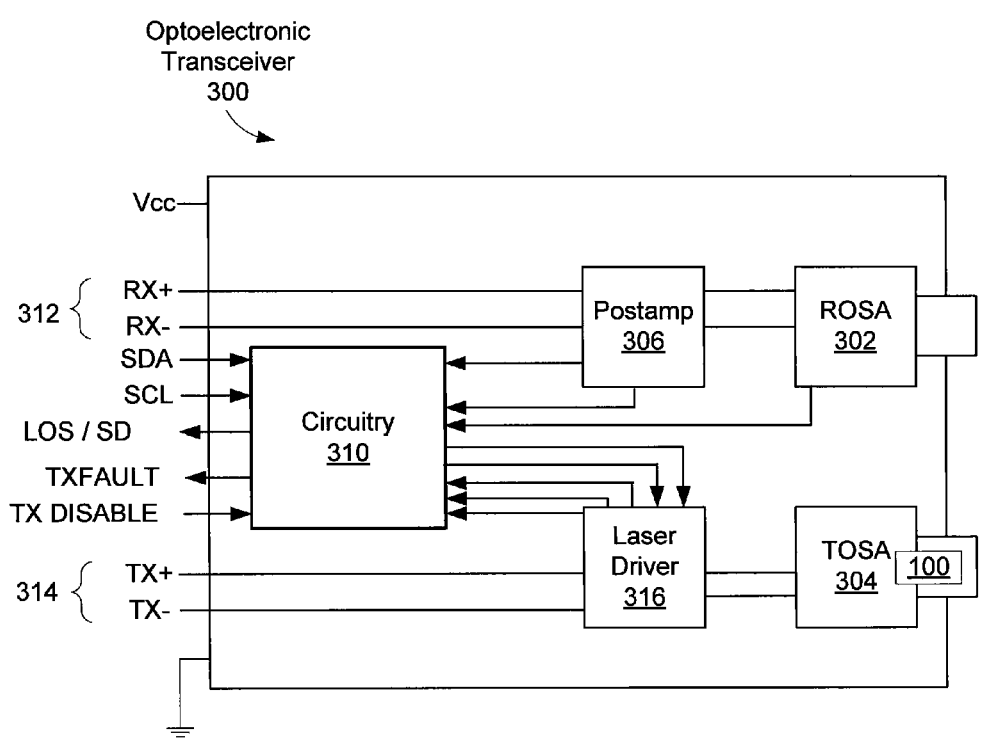
FIG. 3 is a block diagram of an optical transceiver, according to some embodiments.

FIG. 3 is a block diagram illustrating an optical transceiver 300. The optical transceiver 300 may include a receiver optical subassembly (ROSA) 302, a TOSA 304, a post-amplifier (Postamp) 306, a laser driver 316, and other circuitry 310 (e.g., a microcontroller). The ROSA 302 may contain a fiber coupling component as well as a photodiode and a pre-amplifier (preamp) circuit, from which it receives signals. The photodiode may be packaged in a TO can (not shown). The ROSA 302 is connected to the postamp 306. The function of the postamp 306 is to generate a fixed output signal. The postamp 306 can be connected to external circuitry via the RX+ and RX− pins 312. In other embodiments, the postamp 306 can be directly connected to the other circuitry 310 within the optical transceiver 300. In some embodiments, the other circuitry 310 includes a microcontroller.

The TOSA 304 may contain a fiber coupling component as well as a laser diode or light-emitting diode (LED) in a TO package, such as the TO package 100. The TOSA 103 can be connected to the laser driver 316, which receives signals obtained from the TX+ and TX− pins 314. In some embodiments, the laser driver 316 may also be connected to, and receive signals from, the other circuitry 310 within the optical transceiver 300. In some embodiments the other circuitry 310 may include a temperature sensor, an interface, memory, logic, and/or A/D converters. In some embodiments, the other circuitry 310 may be a single integrated circuit. In some embodiments, the memory in the other circuitry 310 may include any nonvolatile memory device, such as an EEPROM. The logic may be any suitable processing logic or the like.

Figure 4:
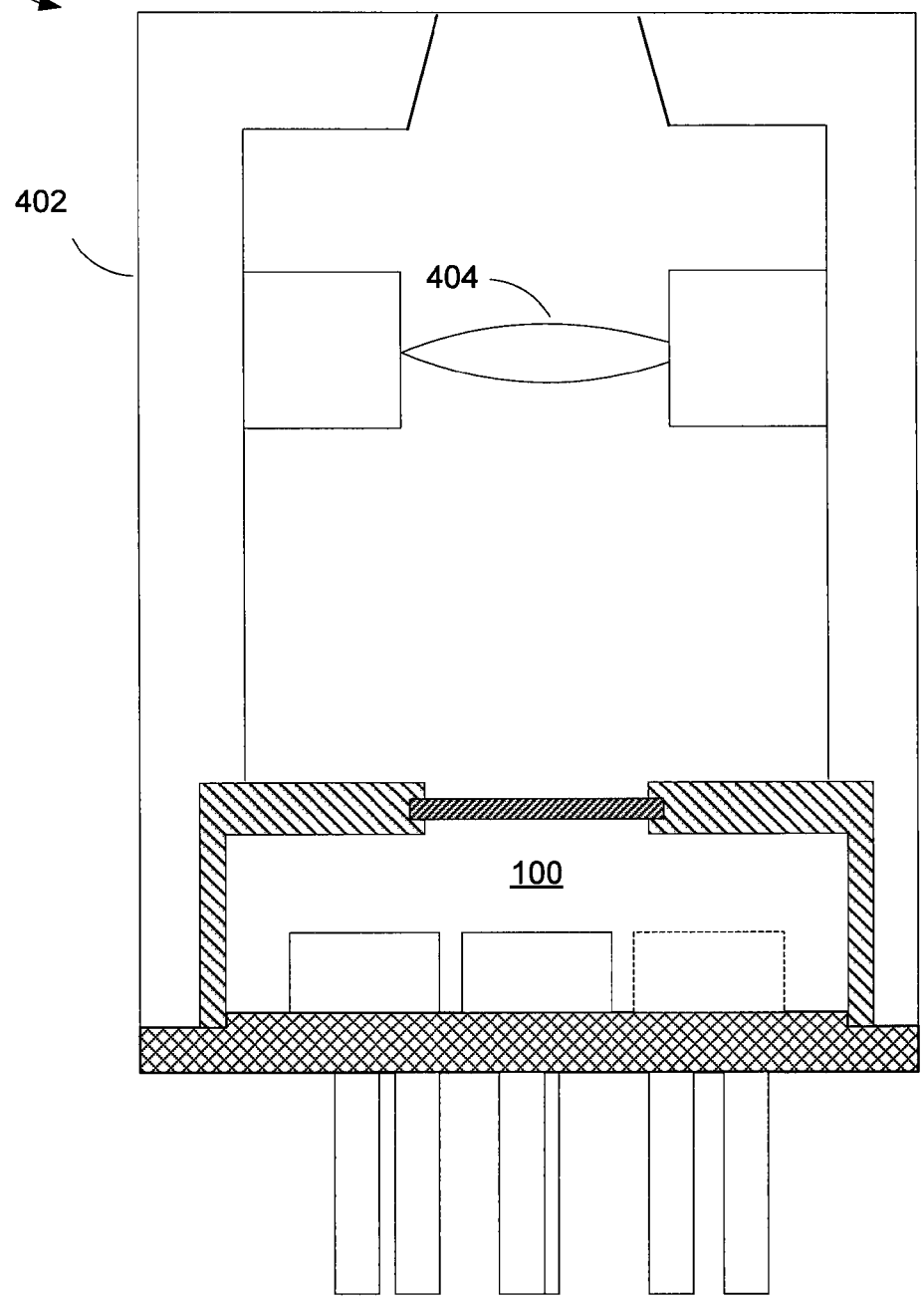
FIG. 4 is a cross sectional view of a transmitter optical subassembly (TOSA) including a TO package, according to some embodiments.

FIG. 4 shows a cross section of a transmitter optical subassembly (TOSA) that includes the TO package 100 illustrated in FIGS. 1A and 1B. After assembly, a TO package 100, such as a laser package, may be received by a TOSA 400. The TOSA 400 comprises a housing 402 configured to receive the TO package 100 at one end, such that the pins of the TO package extend from the TOSA 400 to be available for electrical coupling to the remainder of the optoelectronic assembly. The housing 402 may be made of molded plastic or the like. Epoxy type adhesive may be used to attach the housing 402 to the TO package 100. Other means of adhesives or the like may also be used. In some cases, the TOSA 400 may include a lens 404, or other optical element for manipulating light emitted from the laser, mounted in the TO package 100. The housing 402 may also include an aperture, a fiber coupling component, a pigtail, etc., configured to allow light to be transmitted from the TOSA 400.

Figure 5:
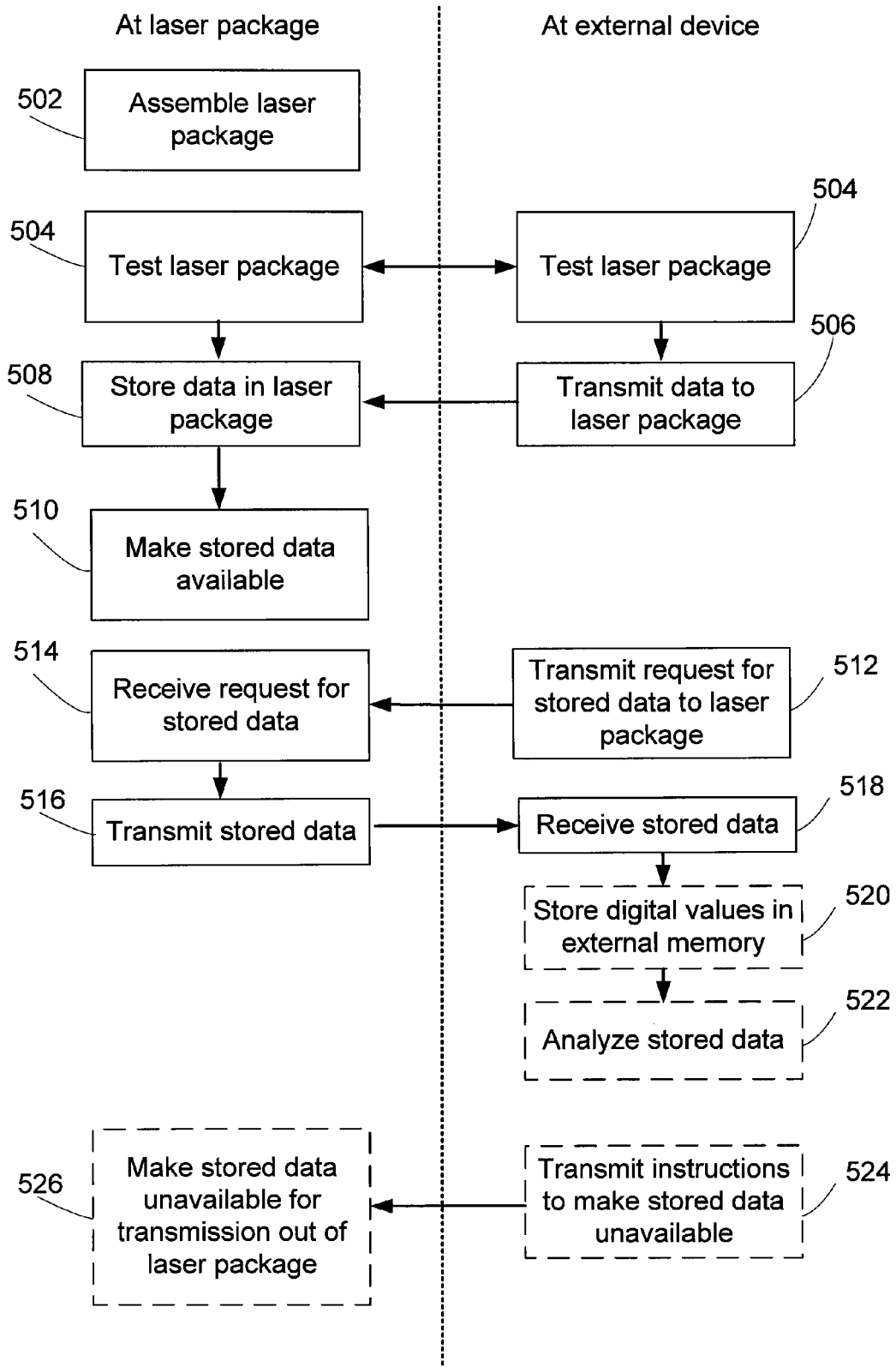
FIG. 5 is a flowchart of a method associated with a TO package and an external device, according to some embodiments.

FIG. 5 is a flow diagram illustrating a method associated with a TO package and an external device, according to some embodiments. A TO package is assembled (502). The TO package may be tested at the TO package and/or at the external device (504). If testing occurs at an external device, test data is transmitted from the external device to the TO package (506). The test data received from the external device and/or test data generated at the TO package are stored in memory in the TO package (508). The stored test data is made available to external devices, such as to the external device (510).

In some embodiments, the external device, may transmit a request for the stored test data to the TO package (512). The request is received at the TO package (514), causing the TO package to transmit at least a portion of the stored data (516). The transmitted data is, in turn, received at the external device (518). Upon receipt of the test data, the external devices stores the digital values in external memory (520). The external device may begin analyzing the transmitted data (522) at any time after receipt of the test data required for analysis.

In some embodiments, an external device may transmit instructions to the TO package indicating that the stored data should be made unavailable (524). For example, a manufacturer may not want to make test data available to end users of the optoelectronic device. In some embodiments, the instructions to make the stored data unavailable may be instructions to blow a fuse, severing the electrical connection to the memory. In response to the instruction, the TO package can make the stored data unavailable for transmission out of the TO package (526) (e.g., by blowing a fuse).

Figure 7A:
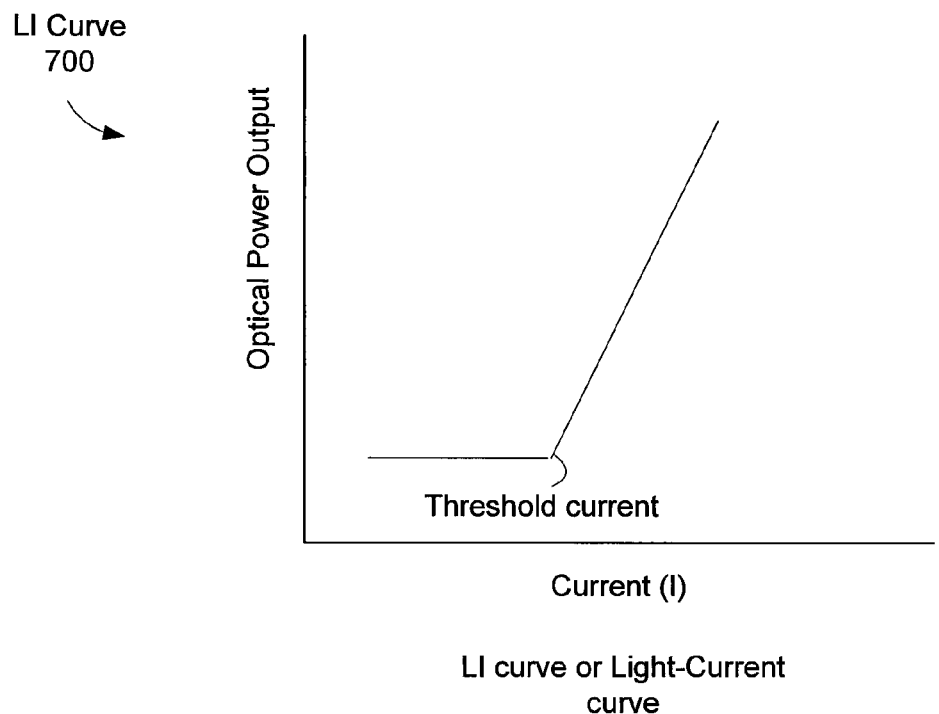
FIG. 7A is a light-current curve for a laser, according to some embodiments.
Figure 7B:
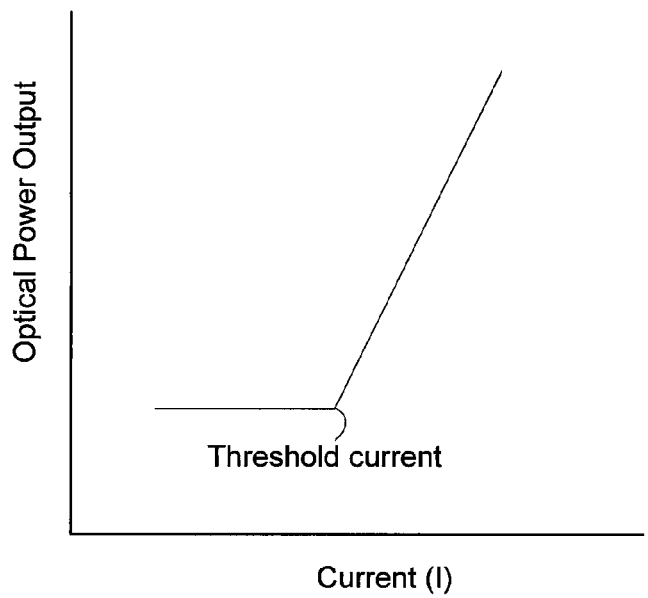
FIG. 7B is a light curve at monitoring temperature for a laser, according to some embodiments.

FIG. 6 is an exemplary memory map for storing data in the memory. The diagnostic and testing data 600 from the manufacturing process may be stored in the memory. In some embodiments, the test data may be stored in a data structure, such as the data structure indicated in FIG. 6. The diagnostic and testing data may include one or more of: a slope efficiency for a laser diode, an operating current for the laser diode at a given monitoring current, a threshold current for the laser diode, a serial number for the laser diode, data corresponding to the light-current (LI) curve for the laser diode, data corresponding to the LI curve at monitoring temperatures (IMON) curve, data generated by testing a performance of the TO package at different temperatures (e.g., temperatures 1 ... N), spectral properties of the laser diode, and data useful for analyzing properties of the TO package. In some embodiments, the test data may include the monitoring current for the laser, the TOSA operating current, and/or other properties related to the TO package. FIG. 7A shows an LI curve, also known as a light-current curve. FIG. 7B shows an IMON curve, also known as a light curve at monitoring temperature. In some embodiments, data representing one or more of the LI curve or IMON curve may be stored in memory within the TO package.

In some embodiments, the data stored in the memory includes data generated by testing at different temperatures (e.g., temperatures 1 ... N in FIG. 6) to measure the temperature dependence of the properties and performance of the laser. For example, the temperatures can include room temperature, operating temperature, "high" temperature, or "low" temperature. Precise measurements of temperature dependence will allow the manufacturer to set a more precise temperature compensation curve for the laser. The temperature compensation curve may be calculated external to the test equipments.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A device comprising:
a transistor outline (TO) package including:
  a housing having a window;
  a substrate;
  circuitry coupled to the substrate within the housing, the circuitry comprising a laser diode and memory storing information related to the TO package; and
  electrical connectors coupled to the substrate and electrically connected to the memory;
wherein the TO package is configured to be embedded in a transmitter optical subassembly.

2. The device of claim 1, wherein the TO package is a sealed transistor outline (TO) can.

3. The device of claim 1, wherein the circuitry includes an amplifier.

4. The device of claim 3, wherein the memory and the amplifier are provided within a common integrated circuit.

5. The device of claim 1, wherein the substrate is a headerboard and the circuitry is configured to be electrically coupled to a ground and at least one power source.

6. The device of claim 5, wherein the ground is a common ground.

7. The device of claim 1, wherein at least one of the electrical connectors electrically connected to the memory is a pogo pin.

8. The device of claim 1, wherein the information related to the TO package includes one or more of:
  a slope efficiency of the laser diode;
  an operating current of the laser diode for a given monitoring current;
  a threshold current for the laser diode;
  a serial number for the laser diode;
  data corresponding to a light-current (LI) curve for the laser diode;
  a light-current curve for the laser diode at monitoring temperature (IMON);
  data generated by testing a performance of the TO package at different temperatures; and
  spectral properties of the laser diode.

9. The device of claim 1, wherein the memory is non-volatile memory.

10. The device of claim 1, wherein the memory is an EEPROM.

11. The device of claim 1, wherein the memory is configured to transmit the information to a device external to the TO package.

12. The device of claim 1, wherein the memory is configured to be read by an external device via at least one electrical connector electrically coupled to the memory.

13. The device of claim 1, wherein at least one of the electrical connectors electrically connected to the memory includes a component that is configured to sever the electrical connection to the memory in response to a predefined input.

14. The device of claim 1, wherein the information related to the TO package is accessible prior to manufacturing of a respective transmitter optical subassembly that includes the TO package as a component but is inaccessible after manufacturing of the respective transmitter optical subassembly has been completed.

15. The device of claim 1, wherein the information related to the TO package stored in the memory includes information related to properties of the TO package before it is integrated into a respective transmitter optical subassembly.

16. A transistor outline (TO) package comprising:
  a substrate having a first side and a second side;
  multiple electrical connectors coupled to the first side of the substrate;
  circuitry coupled to the second side of the substrate, wherein the circuitry comprises:
    a laser diode; and
    a memory storing information related to the TO package; and
  a housing at least partially enclosing the circuitry,
  wherein at least one of the electrical connectors is electrically coupled to the memory; and
  wherein the TO package is configured to be embedded in a transmitter optical subassembly.

17. The TO package of claim 16, wherein the TO package is a sealed transistor outline (TO) can.

18. The TO package of claim 16, wherein the circuitry includes an amplifier.

19. The TO package of claim 18, wherein the memory and the amplifier are provided within a common integrated circuit.

20. The TO package of claim 16, wherein the information related to the TO package is accessible prior to manufacturing of a respective transmitter optical subassembly that includes the TO package as a component but is inaccessible after manufacturing of the respective transmitter optical subassembly has been completed.

* * * * *